United States Patent
Inokuchi et al.

(10) Patent No.: US 10,283,697 B2
(45) Date of Patent: May 7, 2019

(54) MAGNETIC MEMORY INCLUDING A MAGNETORESISTIVE DEVICE THAT INCLUDES A FIRST MAGNETIC LAYER HAVING A FIXED MAGNETIZATION AND A SECOND MAGNETIC LAYER HAVING A CHANGEABLE MAGNETIZATION

(71) Applicant: KABUSHIKI KAISHA TOSHIBA, Minato-ku (JP)

(72) Inventors: Tomoaki Inokuchi, Yokohama (JP); Mizue Ishikawa, Yokohama (JP); Hideyuki Sugiyama, Kawasaki (JP); Yoshiaki Saito, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 46 days.

(21) Appl. No.: 15/266,598

(22) Filed: Sep. 15, 2016

(65) Prior Publication Data
US 2017/0271574 A1 Sep. 21, 2017

(30) Foreign Application Priority Data
Mar. 16, 2016 (JP) .................. 2016-052961

(51) Int. Cl.
*H01L 27/22* (2006.01)
*H01L 43/02* (2006.01)
(Continued)

(52) U.S. Cl.
CPC ............ *H01L 43/02* (2013.01); *G11C 11/161* (2013.01); *G11C 11/1655* (2013.01);
(Continued)

(58) Field of Classification Search
CPC ....... H01L 43/02; H01L 27/222; H01L 43/10; G11C 11/161
See application file for complete search history.

(56) References Cited

U.S. PATENT DOCUMENTS 6,256,223 B1    7/2001   Sun
6,590,268 B2    7/2003   Adachi et al.
(Continued)

FOREIGN PATENT DOCUMENTS

JP    2001-339110 A    12/2001
JP    2004-14806 A     1/2004
(Continued)

OTHER PUBLICATIONS

Yuyan Wang, et al., "Electrical Control of the Exchange Spring in Antiferromagnetic Metals", Advanced Materials, vol. 27, 2015, pp. 3196-3201.
(Continued)

*Primary Examiner* — Benjamin P Sandvik
(74) *Attorney, Agent, or Firm* — Oblon, McClelland, Maier & Neustadt, L.L.P.

(57) ABSTRACT

A magnetic memory according to an embodiment includes: a magnetoresistive device including a first magnetic layer, a second magnetic layer, and a first nonmagnetic layer between the first magnetic layer and the second magnetic layer; a first wiring electrically connected to the first magnetic layer; a second wiring that is electrically connected to the second magnetic layer and contains an antiferromagnetic material; a third wiring crossing the second wiring; an insulating layer between the second wiring and the third wiring; a first write circuit for applying a voltage between the second wiring and the third wiring; and a read circuit electrically connected to the first wiring and the second wiring.

31 Claims, 18 Drawing Sheets

(51) Int. Cl.
  *G11C 11/16* (2006.01)
  *H01L 43/08* (2006.01)
  *H01L 43/10* (2006.01)
  *G11C 11/18* (2006.01)

(52) U.S. Cl.
  CPC ...... *G11C 11/1657* (2013.01); *G11C 11/1659* (2013.01); *G11C 11/1673* (2013.01); *G11C 11/1675* (2013.01); *G11C 11/18* (2013.01); *H01L 27/222* (2013.01); *H01L 43/08* (2013.01); *H01L 43/10* (2013.01)

(56) References Cited

U.S. PATENT DOCUMENTS

| | | | | |
|---|---|---|---|---|
| 7,092,283 | B2* | 8/2006 | Jeong | G11C 11/15 365/158 |
| 7,750,390 | B2* | 7/2010 | Saito | G11C 11/16 257/314 |
| 8,189,370 | B2 | 5/2012 | Hayakawa | |
| 8,964,459 | B2 | 2/2015 | Nakai et al. | |
| 9,230,625 | B2 | 1/2016 | Inokuchi et al. | |
| 2003/0161181 | A1* | 8/2003 | Saito | G11C 11/16 365/173 |
| 2004/0052131 | A1* | 3/2004 | Komuro | G11C 11/16 365/202 |
| 2005/0254290 | A1* | 11/2005 | Hidaka | G11C 7/18 365/158 |
| 2005/0260773 | A1* | 11/2005 | Hong | G11C 11/16 438/3 |
| 2008/0006890 | A1* | 1/2008 | Haratani | G11C 11/16 257/427 |
| 2009/0057794 | A1* | 3/2009 | Guo | G11C 11/15 257/421 |
| 2014/0071743 | A1* | 3/2014 | Kim | G11C 11/1675 365/158 |
| 2014/0151828 | A1* | 6/2014 | Worledge | H01L 43/12 257/421 |
| 2015/0188037 | A1* | 7/2015 | Nam | H01L 43/12 257/421 |

FOREIGN PATENT DOCUMENTS

| | | |
|---|---|---|
| JP | 2005-12068 A | 1/2005 |
| JP | 2007-88068 A | 4/2007 |
| JP | 2007-250811 A | 9/2007 |
| JP | WO 2010/032574 A1 | 3/2010 |
| JP | 2011-124462 A | 6/2011 |
| JP | WO 2012/173279 A1 | 12/2012 |
| JP | 2013-197540 | 9/2013 |
| JP | 2014-203931 A | 10/2014 |
| JP | 2014-229706 A | 12/2014 |

OTHER PUBLICATIONS

T. Maruyama, et al., "Large voltage-induced magnetic anisotropy change in a few atomic layers of iron", Nature Nanotechnology, vol. 4, 2009, pp. 158-161.

* cited by examiner

MAGNETIC MEMORY INCLUDING A MAGNETORESISTIVE DEVICE THAT INCLUDES A FIRST MAGNETIC LAYER HAVING A FIXED MAGNETIZATION AND A SECOND MAGNETIC LAYER HAVING A CHANGEABLE MAGNETIZATION

CROSS REFERENCE TO RELATED APPLICATIONS

This application is based upon and claims the benefit of priority from the prior Japanese Patent Application No. 2016-052961, filed on Mar. 16, 2016, the entire contents of which are incorporated herein by reference.

FIELD

An embodiment described herein relates to a magnetic memory.

BACKGROUND

In recent years, attempts have been actively performed for applying a magnetoresistive effect device utilizing a tunnel magnetoresistive effect to magnetic random access memory as a memory device. The magnetic random access memory using the magnetoresistive effect device has a feature in which data can be stored in a non-volatile manner, and the write/read time is 10 ns or less, and the number of times of rewriting is $10^{15}$ or more.

Writing to the magnetoresistive effect device is performed by a spin transfer torque magnetization switching method in general, and magnetization of a magnetic storage layer is switched by injecting spin-polarized electrons (spin injection current) into the magnetic storage layer of the memory device. Since an amount of the current required for writing is decreased with miniaturization of the magnetic storage layer, the method is greatly expected as a writing method of the magnetic random access memory.

However, since magnetization writing by the spin transfer torque magnetization switching is a current writing method in principle, and a large current density is required of about 0.5 MA/cm$^2$ in the present circumstances, problems have occurred such as an increase in power consumption, an increase in a peripheral circuit area, and an increase in a cell selection transistor area.

To solve these problems, in recent years, a voltage magnetization writing method has been known. In the voltage magnetization writing method, by applying a voltage to the magnetic storage layer of the magnetoresistive effect device via an insulating layer, the number of electrons is changed of the magnetic storage layer in the vicinity of an interface with the insulating layer, and a magnetization direction of the magnetic storage layer is changed. When the voltage magnetization writing method is used, the above-described problems in the conventional spin transfer torque magnetization switching method can be solved, and a low power consumption magnetic random access memory can be configured. However, in a case in which the voltage magnetization writing method is used to the normal magnetoresistive effect device, that is, in a case in which the magnetization direction is controlled by applying an electric field to the magnetic storage layer via a tunnel barrier (tunnel insulating layer) of the magnetoresistive effect device, there is a problem that it is necessary to develop a technique for preventing breakdown of the tunnel barrier, and a material for increasing an amount of change of a magnetization state to an applied voltage.

As described above, the voltage writing method magnetic random access memory to which attention has been paid in recent years has advantages in reducing power consumption and increasing a degree of integration, but it is necessary to solve problems, such as suppression of breakdown of the tunnel barrier, and an increase in an amount of modulation of the magnetization state to the applied voltage.

DETAILED DESCRIPTION

A magnetic memory according to an embodiment includes: a magnetoresistive device including a first magnetic layer, a second magnetic layer, and a first nonmagnetic layer between the first magnetic layer and the second magnetic layer; a first wiring electrically connected to the first magnetic layer; a second wiring that is electrically connected to the second magnetic layer and contains an antiferromagnetic material; a third wiring crossing the second wiring; an insulating layer between the second wiring and the third wiring; a first write circuit for applying a voltage between the second wiring and the third wiring; and a read circuit electrically connected to the first wiring and the second wiring.

Hereinafter, embodiments are described in detail with reference to the drawings.

(First Embodiment)

Figure 1:
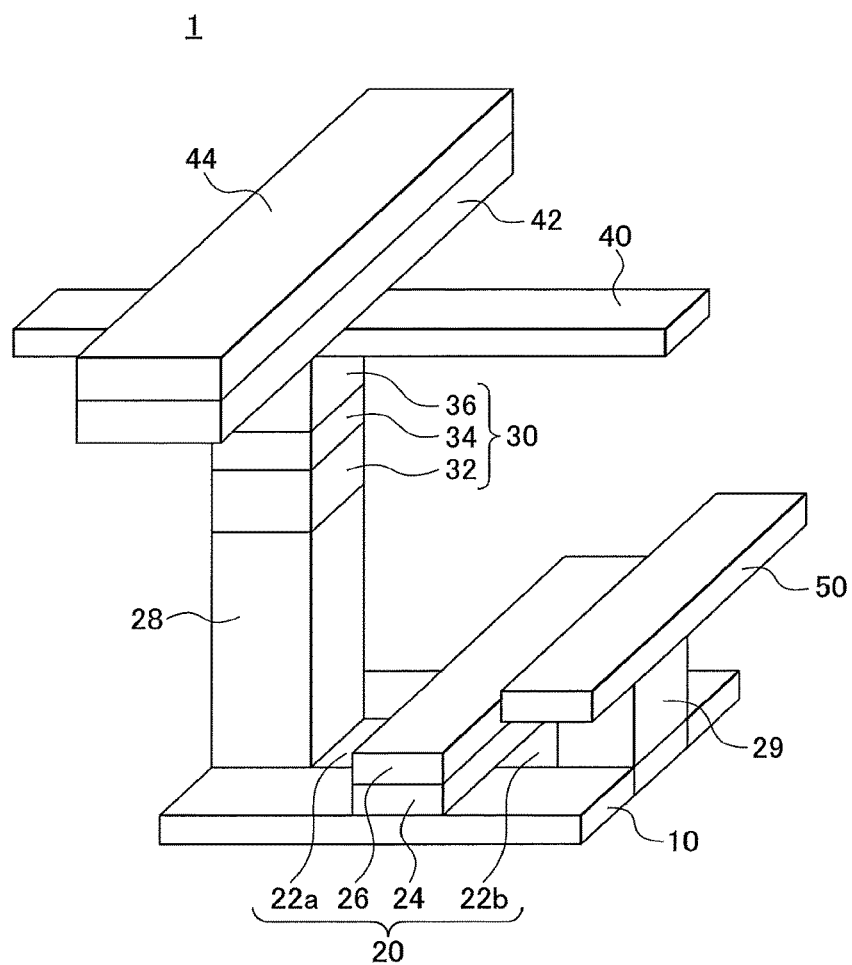
FIG. 1 is a perspective view showing a memory cell of a magnetic memory of a first embodiment.

A magnetic memory according to a first embodiment is described with reference to FIG. 1 to FIG. 4. The magnetic memory of the first embodiment has memory cells arranged in a matrix form, and each memory cell 1 includes: a selection transistor (selection device) 20; an MTJ (Magnetic Tunnel Junction) device 30 as a magneto-resistive device; a bit line 40 containing an antiferromagnetic material; an insulating layer 42 arranged on the bit line 40; an electrode 44 arranged on the insulating layer 42; and a word line 50, as shown in FIG. 1.

The selection transistor 20 has: a source and a drain, 22a and 22b, separately arranged in a semiconductor layer 10; a gate insulating layer 24 provided on a portion of the semiconductor layer 10 between the source and the drain; and a gate electrode 26 provided on the gate insulating layer 24. The gate electrode 26 is a selection word line for selecting the memory cell 1. Incidentally, in the description below, one of the source and the drain is represented as a terminal 22a, and the other is represented as a terminal 22b.

The MTJ device 30 is arranged on the terminal 22a via a plug 28. The MTJ device 30 has: a reference layer 32 that is connected to the plug 28 and has fixed magnetization; a nonmagnetic insulating layer (tunnel barrier) 34 arranged on the reference layer 32; and a storage layer 36 that is arranged on the tunnel barrier 34 and has changeable magnetization. The bit line 40 is arranged on the storage layer 36. The word line 50 is arranged on the terminal 22b via a plug 29.

A writing method and a reading method of the memory cell 1 thus configured are described with reference to FIG. 2A to FIG. 5.

(Writing Principle)

Figure 2A:
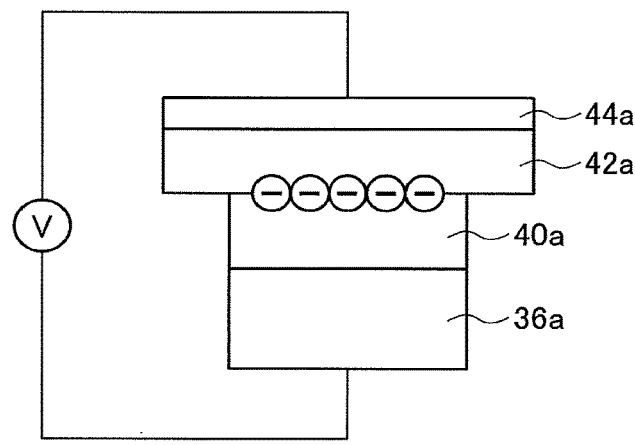
FIGS. 2A and 2B are diagrams for explaining a principle of writing.
Figure 2B:
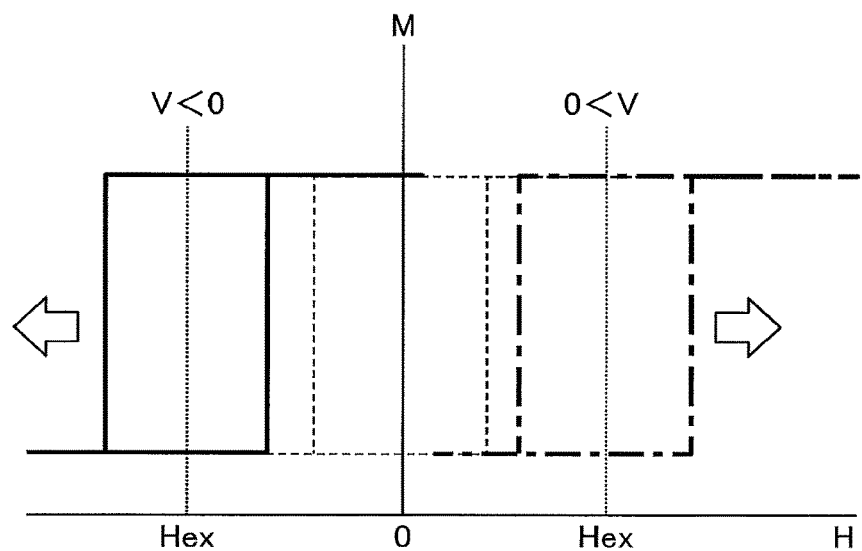

First, in a device having a structure of electrode 44a/insulating layer 42a/antiferromagnetic material 40a/ferromagnetic material 36a shown in FIG. 2A, when a voltage V is applied between the electrode 44a and the ferromagnetic material 36a, the number of electrons is modulated at an interface between the insulating layer 42 and the antiferromagnetic material 40a. For this reason, it has been known that, as shown in FIG. 2B, magnitude of an exchange magnetic field Hex is shifted that is sensed by the ferromagnetic material 36a depending on magnitude of the voltage applied, and a direction to be shifted is changed depending on a direction of an electric field, that is, whether polarity of the applied voltage V is positive or negative (for example, see Y. Y. Wang, et al., Adv. Mater. 27, 3196 (2015)). Incidentally, in the device shown in FIG. 2A, FIG. 2B, IrMn has been used as the antiferromagnetic material 40a, and CoPt having perpendicular magnetic anisotropy has been used as the ferromagnetic material 36a. The device shown in FIG. 2A as it is cannot be used as a memory.

Therefore, to use the above device as a memory, the inventors has devised the memory cell 1 including a configuration in which the electrode 44 and the wiring line 40 of the antiferromagnetic material are arranged in a crosspoint form as shown in FIG. 1. Incidentally, in FIG. 1, the insulating layer 42 is shown as extending in the same direction as the electrode 44. However, the extending direction of the insulating layer 42 has no relation to essential operation of the magnetic memory, and the insulating layer 42 may be extended in any direction. Further, the insulating layer 42 is not required to be separated for each memory cell, that is, the insulating layer 42 may be formed on an entire surface.

(Writing Method)

Figure 3:
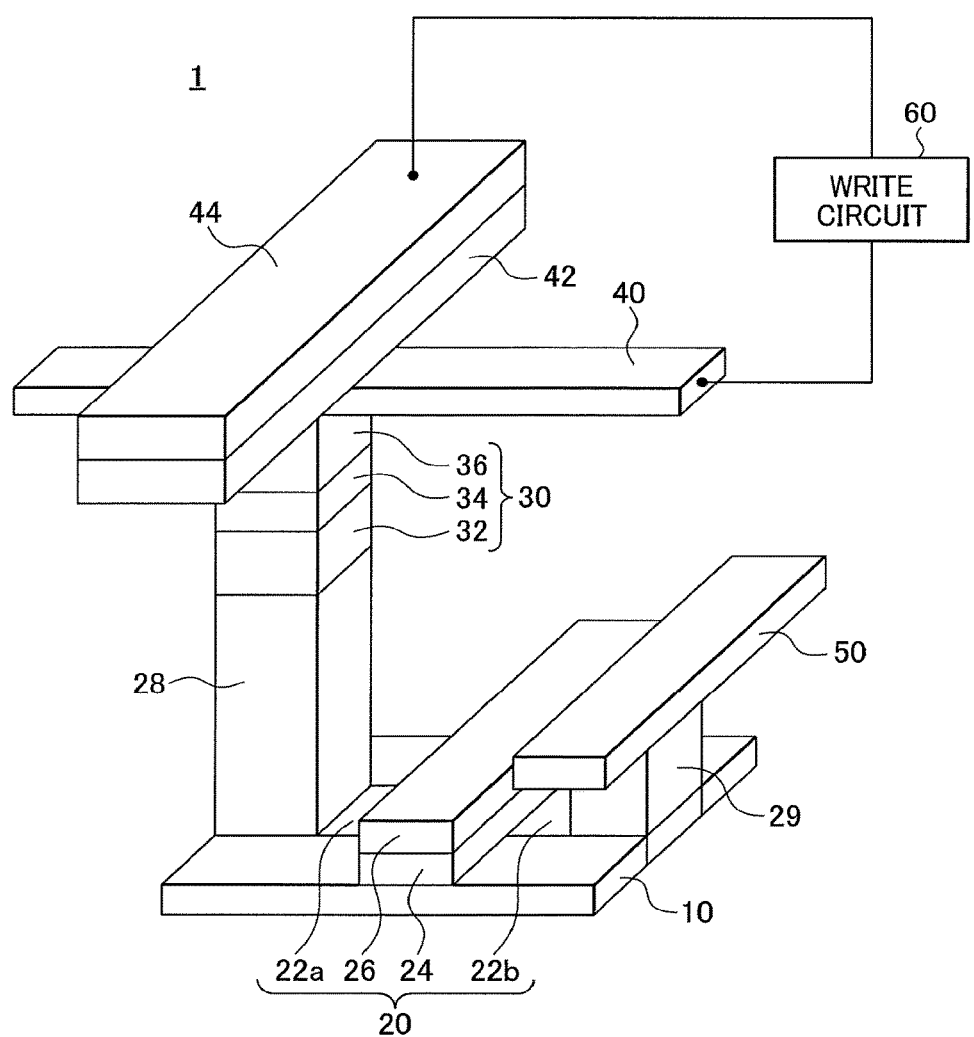
FIGS. 3 and 4 are diagrams for explaining a writing method of the magnetic memory of the first embodiment.
Figure 4:
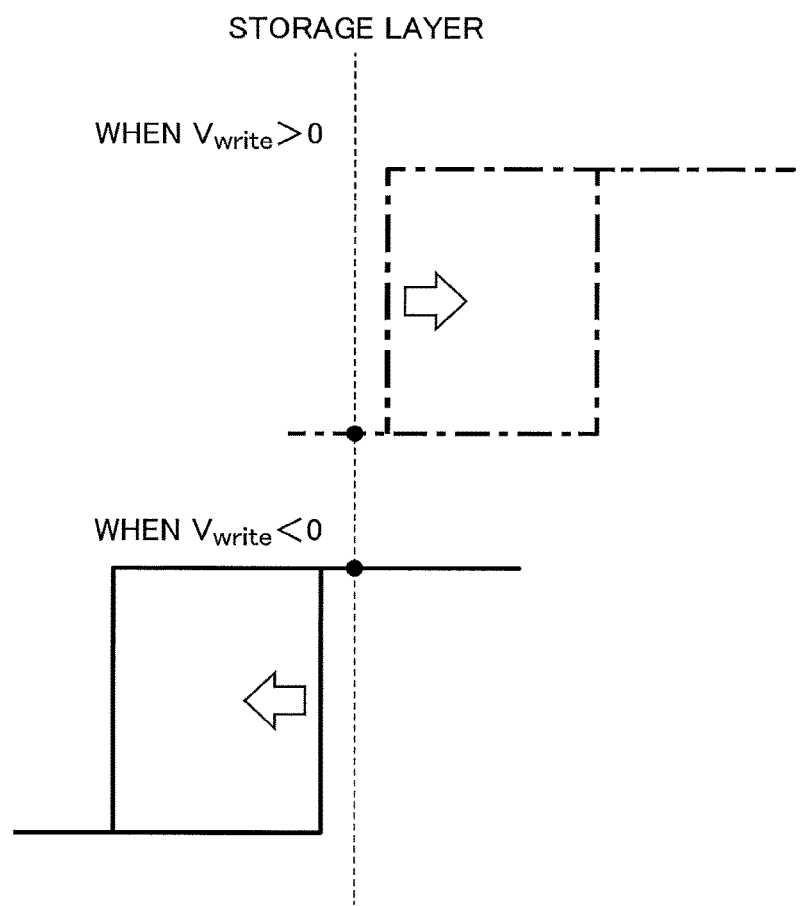

During writing, as shown in FIG. 3, a write voltage $V_{write}$ is applied between the electrode 44 and the bit line 40 of the antiferromagnetic material by a write circuit 60. Since the write voltage $V_{write}$ applied between the electrode 44 and the bit line 40 modulates the number of electrons at the interface between the insulating layer 42 and the bit line 40, the magnetic field Hex of the ferromagnetic material provided below the bit line 40 is shifted according to the principle described above. At this time, as shown in FIG. 4, by adjusting the direction and magnitude of the electric field, a direction of the magnetization of the storage layer 36 to that of the reference layer 32 can be controlled to be substantially parallel, or antiparallel.

(Reading Method)

Figure 5:
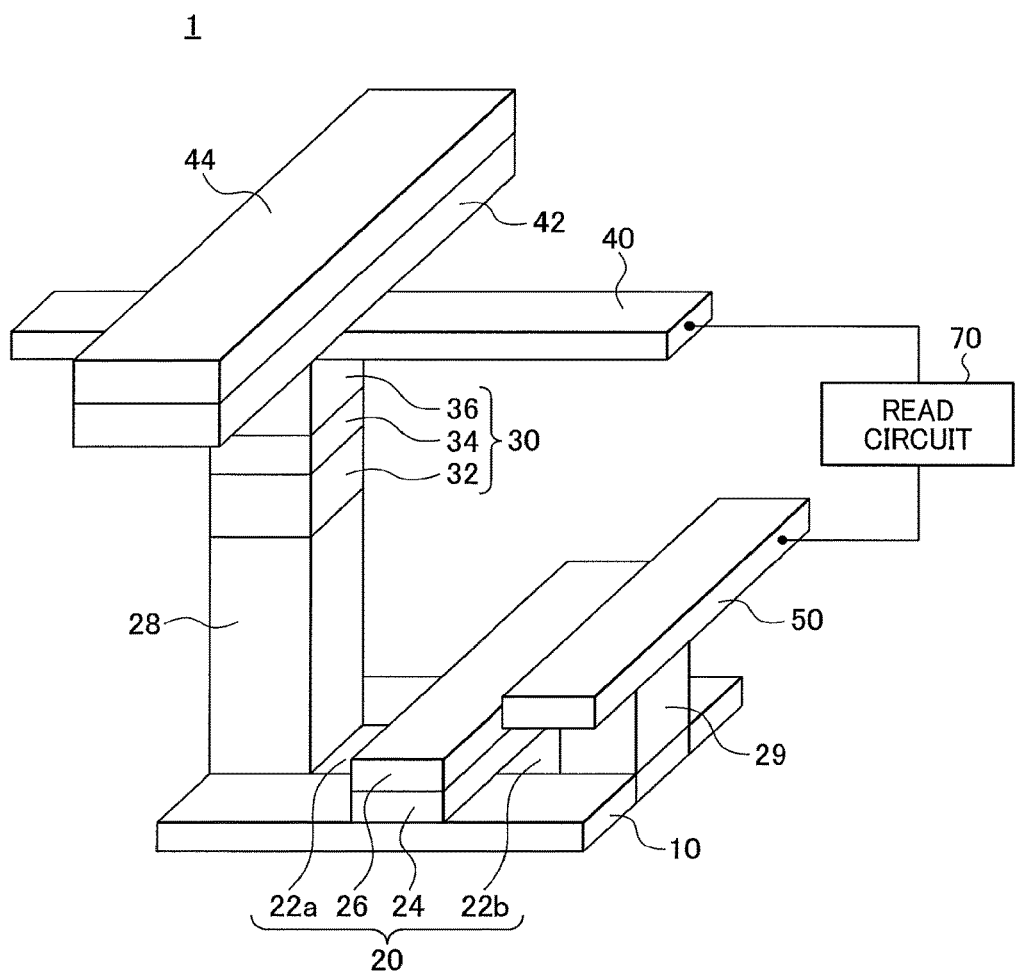
FIG. 5 is a diagram for explaining a reading method of the magnetic memory of the first embodiment.

During reading, a voltage to be applied to the gate electrode 26 is controlled so that the selection transistor 20 of the desired memory cell 1 is an ON state, and in this state, as shown in FIG. 5, by reading a resistance value between the word line 50 and the bit line 40 by a read circuit 70, the direction of the magnetization of the storage layer 36 to that of the reference layer 32 is determined.

In the magnetic memory of the present embodiment, it is possible to use a high dielectric material, so-called High-k material, for the insulating layer 42 to be used for writing, so that a modulation rate can be increased of a magnetization state of the storage layer 36 to the voltage applied to the electrode 44.

In addition, in the present embodiment, different from a writing method in which spin transfer torque magnetization switching is used to a normal magnetoresistive effect device, a write current does not flow through the tunnel barrier of the magnetoresistive effect device, so that a requirement for dielectric breakdown of the tunnel barrier also can be eased.

Further, in a case in which the writing method using the above spin transfer torque magnetization switching is used, it is necessary to suppress a resistance of the tunnel barrier by limitation of a value of a current that is allowed to flow through the selection transistor or the like. However, in the present embodiment, a tunnel current flowing through the MTJ device 30 only flows during reading, so that the limitation is eliminated of the value of the current that is allowed to flow through the selection transistor or the like. Therefore, the tunnel resistance of the MTJ device 30 can be determined in consideration of an operating speed of the memory or the like, so that a degree of freedom in design can be increased.

Incidentally, since the magnetic memory of the present embodiment has a crosspoint structure, there is a problem that, at the time of writing, a voltage is also applied to a bit line or an electrode 44 of a memory cell other than a memory cell to which writing is performed, which is a problem of so-called half selection. To avoid the problem, a write inhibit voltage, for example, $V_{write}/2$, is applied to an electrode 44 connected to another memory cell connected to the same bit line 40 as that of the memory cell to which writing is performed, and the write inhibit voltage, for example, $V_{write}/2$, is applied to a bit line connected to another memory cell connected to the same electrode 44 as that of the memory cell to which writing is performed. Thus, in the other memory cell connected to the same bit line 40 as that of the memory cell to which writing is performed and the other memory cell connected to the same electrode 44 as that of the memory cell to which writing is performed, a voltage between the bit line 40 and the electrode 44 is $V_{write}/2$, so that it can be prevented that writing is performed.

(First Modification)

Figure 6:
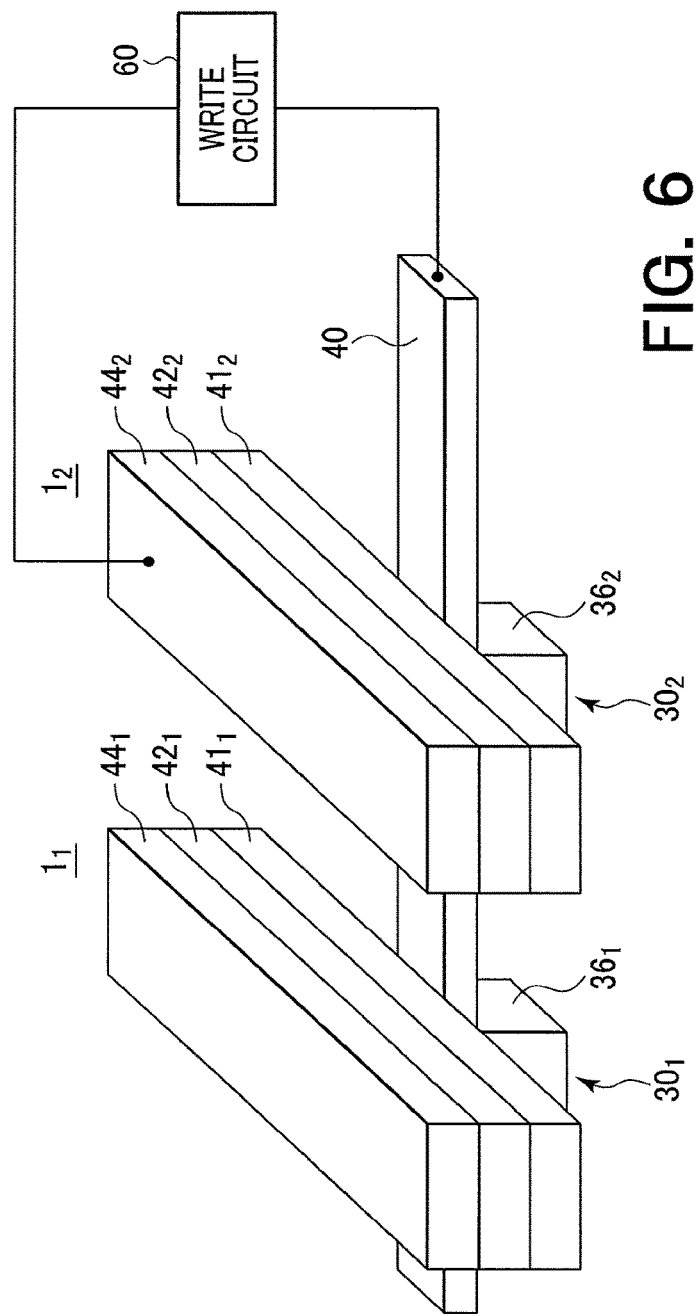
FIG. 6 is a perspective view showing a part of the magnetic memory of a first modification of the first embodiment.

A magnetic memory according to a first modification of the present embodiment is described with reference to FIG. 6. FIG. 6 is a perspective view showing a part of the magnetic memory of the first modification. The magnetic memory of the first modification has a configuration in which, in the magnetic memory of the first embodiment, the bit line 40 is formed from a single antiferromagnetic material made of metal, for example, IrMn, and between the bit line 40 and the insulating layer 42 of each memory cell, an antiferromagnetic material, for example, a NiO layer, is arranged that has a less number of carriers than that of the antiferromagnetic material contained in the bit line. Here, the carrier means a particle that serves function of electrical conduction.

As shown in FIG. 6, two memory cells $1_1$, $1_2$ are connected to the bit line 40, and each memory cell $1_i$ (i=1, 2) has: the selection transistor not shown; the MTJ device $30_i$ having the storage layer $36_i$ electrically connected to the above selection transistor; the word line not shown connected to the selection transistor; the bit line 40 of the antiferromagnetic material made of metal; the insulating layer $42_i$; the electrode $44_i$; and an antiferromagnetic layer $41_i$ that is arranged between the bit line 40 and the insulating layer $42_i$, and has the less number of carriers. Incidentally, an antiferromagnetic material made of oxide includes $Cr_2O_3$, MnO, $Fe_2O_3$, CoO, MnGa, and MnAs, besides NiO.

As shown in FIG. 1, when electric field operation from the electrode 44 is performed by using a laminate structure of electrode 44/insulating layer 42/antiferromagnetic material 40/ferromagnetic material 36, since the number of electrons is modulated only in the electrons in the vicinity of an interface between the insulating layer 42 and the antiferromagnetic material 40, a film thickness of the antiferromagnetic material 40 has to be made thinner to increase an amount of modulation of a magnetization state by the electrode 44. However, when the film thickness of the antiferromagnetic material 40 is made thinner, an operating temperature is decreased since a blocking temperature is decreased. To avoid this problem, as in the first modification, a laminate structure may be used of an antiferromagnetic material that has the less number of carriers than that of the antiferromagnetic material made of metal configuring the bit line 40, for example, the antiferromagnetic material made of oxide, and an antiferromagnetic material made of metal. This is because: a shielding distance is longer in a case in which the number of carriers is less, so that responsiveness to the electrode 44 can be ensured even when a thickness is thicker; meanwhile, the blocking temperature is increased due to the fact that the thickness is thicker. Of course, a laminate structure may be used of electrode/insulating layer/antiferromagnetic material that has the less number of carriers/ferromagnetic material. In this case, in the memory cell of the first embodiment shown in FIG. 1, the bit line 40 is formed from the antiferromagnetic material that has the less number of carriers.

(Second Modification)

Figure 7:
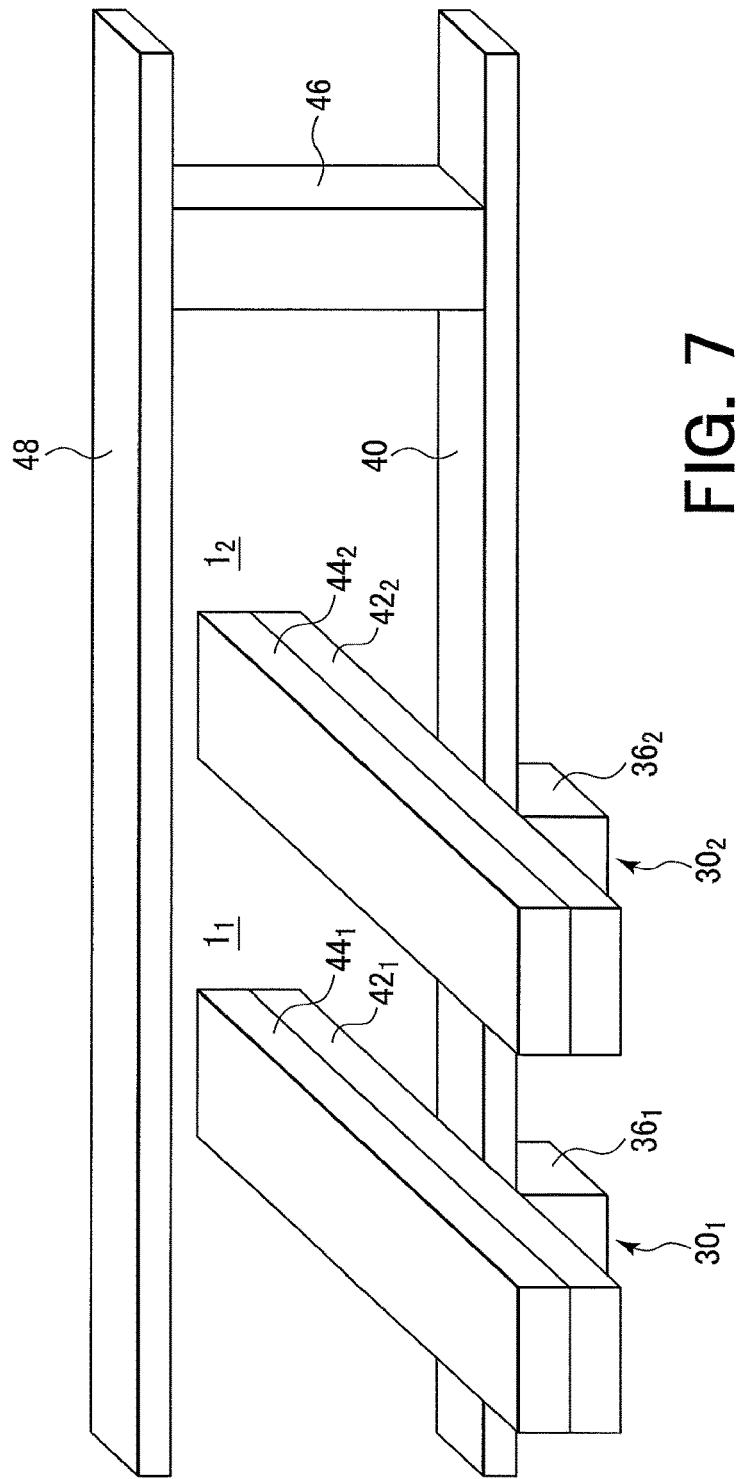
FIG. 7 is a perspective view showing a part of the magnetic memory of a second modification of the first embodiment.

In a case in which there is a problem that a resistance of the wiring line made of the antiferromagnetic material is high, a magnetic memory may be configured as a second modification show in FIG. 7. The magnetic memory of the second modification has a structure in which, in the magnetic memory of the first modification, plural memory cells connected to the bit line 40 of the antiferromagnetic material are connected to a low resistance global bit line 48 via a plug 46, in the middle of the bit line 40. As the low resistance global bit line 48, a low resistance material is used, such as Cu or Al.

Next, a material is described of a constituent used for the magnetic memory of the first embodiment and modifications thereof.

(Reference Layer, Storage Layer)

In the above description, each of the reference layer 32 and the storage layer 36 of the MTJ device 30 is a perpendicular magnetization layer having perpendicular magnetic anisotropy, that is, magnetization whose magnetization direction is perpendicular to each surface facing the tunnel barrier 34; however, each of the layers may be an in-plane magnetization layer, that is, a magnetic layer having magnetization whose magnetization direction is parallel to each surface facing the tunnel barrier 34.

The magnetic layer used for the reference layer 32 or the storage layer 36 desirably has unidirectional anisotropy. A film thickness of the magnetic layer is preferably from 0.1 nm to 100 nm. Further, the thickness of the magnetic layer has to be thick enough so as not to be superparamagnetic, and is more desirably 0.4 nm or more. As a material of the magnetic layer, a Heusler alloy can be used, such as $Co_2FeAl_{1-x}Si_x$, or $Co_2Mn_{1-x}Fe_xSi$.

In addition, as the above magnetic layer, a metal containing at least one element of Co, Fe, or Ni, and an alloy thereof are used, for example, Co—Pt, Co—Fe—Pt, Fe—Pt, Co—Fe—Cr—Pt, Co—Cr—Pt, Co—Pd, NiMnSb, $Co_2MnGe$, $Co_2MnAl$, $Co_2MnSi$, CoCrFeAl. As used herein, a phrase referring to "at least one of" a list of items refers to any combination of those items, including a single member. As an example, "at least one of: a, b, or c" is intended to cover a, b, c, a-b, a-c, b-c, and a-b-c."

Further, as the above magnetic layer, a magnetic semiconductor may be used, such as GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, or SiGeMn.

Incidentally, by adding to the above magnetic layer a nonmagnetic element, such as silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), or niobium (Nb), it is possible to adjust magnetic characteristics, and to adjust various physical properties, such as crystallinity, mechanical properties, and chemical properties.

(Antiferromagnetic Material)

As the bit line 40 or the antiferromagnetic layer 41, Iron-manganese (FeMn), Platinum-manganese (PtMn), Platinum-chromium-manganese (PtCrMn), Nickel-manganese (NiMn), Iridium-manganese (IrMn), Nickel oxide (NiO), Iron oxide ($Fe_2O_3$), Manganese gallium (MnGa), or manganese arsenide (MnAs) can be used.

(Insulating Layer 42)

As the insulating layer 42, an insulator or the like is used that contains a high dielectric such as Al oxide ($Al_2O_3$), LaAlSi oxide (LaAlSiO), Hf oxide ($HfO_2$), LaAl oxide (LaAlO), Zr oxide ($ZrO_2$), La oxide ($La_2O_3$), or Ti oxide. The insulator containing Ti oxide includes an insulator containing $TiO_2$, or an oxide in which at least one element of from group 2 to group 5 and lanthanoid is added to Ti oxide. The insulator is preferably has a band offset of 1 eV or more to a magnetic material used for the storage layer.

Figure 8:
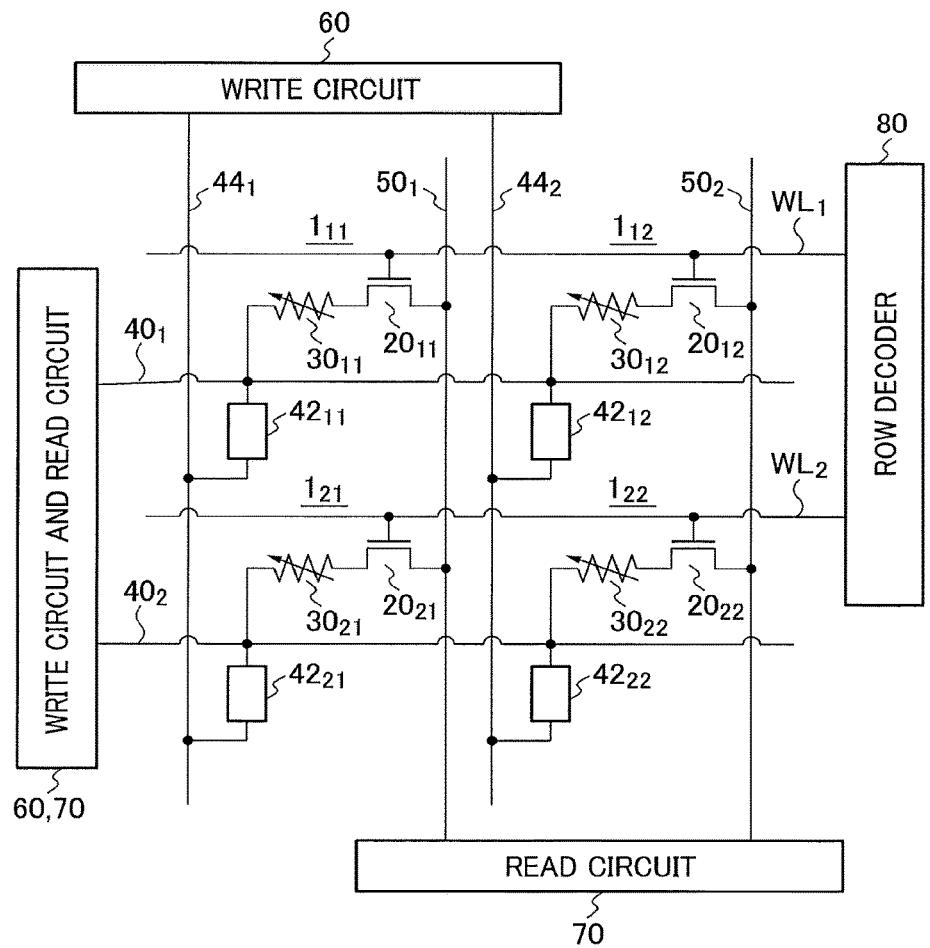
FIG. 8 is a diagram showing an example of a circuit of the magnetic memory of the first embodiment.

Next, an example of a circuit of the magnetic memory of the first embodiment is shown in FIG. 8. In the magnetic memory, the memory cells 1 shown in FIG. 1 are arranged in a 2×2 matrix form. In each of the memory cells of a first row, the gate electrode 26 of the selection transistor 20 is connected to a selection word line $WL_1$, and the storage layer 36 (see FIG. 1) of the MTJ device 30 and the insulating layer 42 (see FIG. 1) are connected to the bit line $40_1$. In each of the memory cell of a second row, the gate electrode 26 of the selection transistor 20 is connected to a selection word line $WL_2$, and the storage layer 36 (see FIG. 1) of the MTJ device 30 and the insulating layer 42 are connected to the bit line $40_2$. These selection word lines $WL_1$, $WL_2$ are selected by a row decoder 80.

In each of the memory cells of a first column, the terminal 22b (see FIG. 1) of the selection transistor 20 is connected to the word line $50_1$, and the insulating layer 42 (see FIG. 1) is connected to the electrode $44_1$. In each of the memory cells of a second column, the terminal 22b (see FIG. 1) of the selection transistor 20 is connected to the word line $50_2$, and the insulating layer 42 (see FIG. 1) is connected to the electrode $44_2$.

Each of the bit lines $40_1$, $40_2$ and the electrodes $44_1$, $44_2$ is connected to the write circuit 60 (see FIG. 3). In addition, each of the bit lines $40_1$, $40_2$ and the word lines $50_1$, $50_2$ is connected to the read circuit 70 (see FIG. 5).

In the magnetic memory circuit shown in FIG. 8, in a case in which writing is performed to a first row and first column memory cell, the write voltage $V_{write}$ is applied between the bit line $40_1$ and the electrode $44_1$ by the write circuit 60. In a case in which reading is performed from the first row and first column memory cell, the selection word line $WL_1$ is selected by the row decoder 80, and a voltage is applied in which the selection transistor 20 is the ON state. Further, a constant current is supplied between the bit line $40_1$ and the word line $50_1$ by the read circuit 70 and a voltage is read, or a read voltage is applied between the bit line $40_1$ and the word line $50_1$ and a current is read that flows between the bit line $40_1$ and the word line $50_1$.

As described above, with the first embodiment, in writing, the write current does not flow through the tunnel barrier of the MTJ device, and a voltage is applied between the bit line 40 and the electrode 44. The high dielectric can be used as the insulating layer 42 positioned between the bit line 40 and the electrode 44. Thus, a magnetic memory can be provided in which breakdown of the insulating layer is suppressed and voltage writing is possible.

(Second Embodiment)

Figure 9:
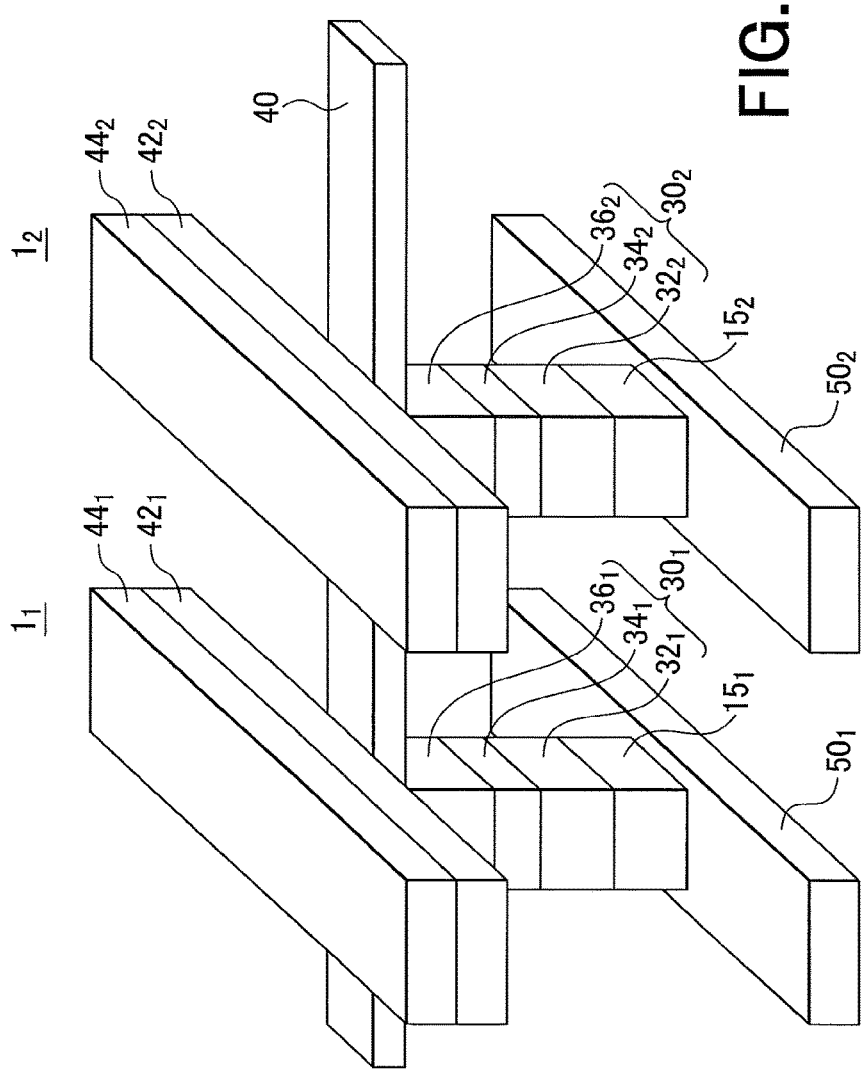
FIG. 9 is a perspective view showing a magnetic memory of a second embodiment.

A magnetic memory according to a second embodiment is shown in FIG. 9. The magnetic memory of the second embodiment has a configuration in which, in the magnetic memory of the first embodiment shown in FIG. 1, the selection transistor 20 is removed and a diode is provided instead. The magnetic memory of the second embodiment has plural (two in FIG. 9) memory cells $1_1$, $1_2$ arranged in a matrix form.

Each memory cell $1_i$ (i=1, 2) includes a word line $50_i$, a diode (selection device) $15_i$, an MTJ device $30_i$, a bit line 40, an insulating layer $42_i$, and an electrode $44_i$. The diode $15_i$ (i=1, 2) is electrically connected to the word line $50_i$ at a first terminal, and is electrically connected to a reference layer of the MTJ device $30_i$ at a second terminal. Here, "A is electrically connected to B" means that A is directly connected to B, or A is connected to B through a conductor provided between A and B. In addition, the first terminal is one terminal of an anode and a cathode, and the second terminal is the other terminal of the anode and the cathode.

A storage layer 36 of the MTJ device $30_i$ (i=1, 2) is electrically connected to the electrode $44_i$ via the bit line 40 of an antiferromagnetic material and the insulating layer $42_i$ of a high dielectric.

(Writing Method)

Figure 10:
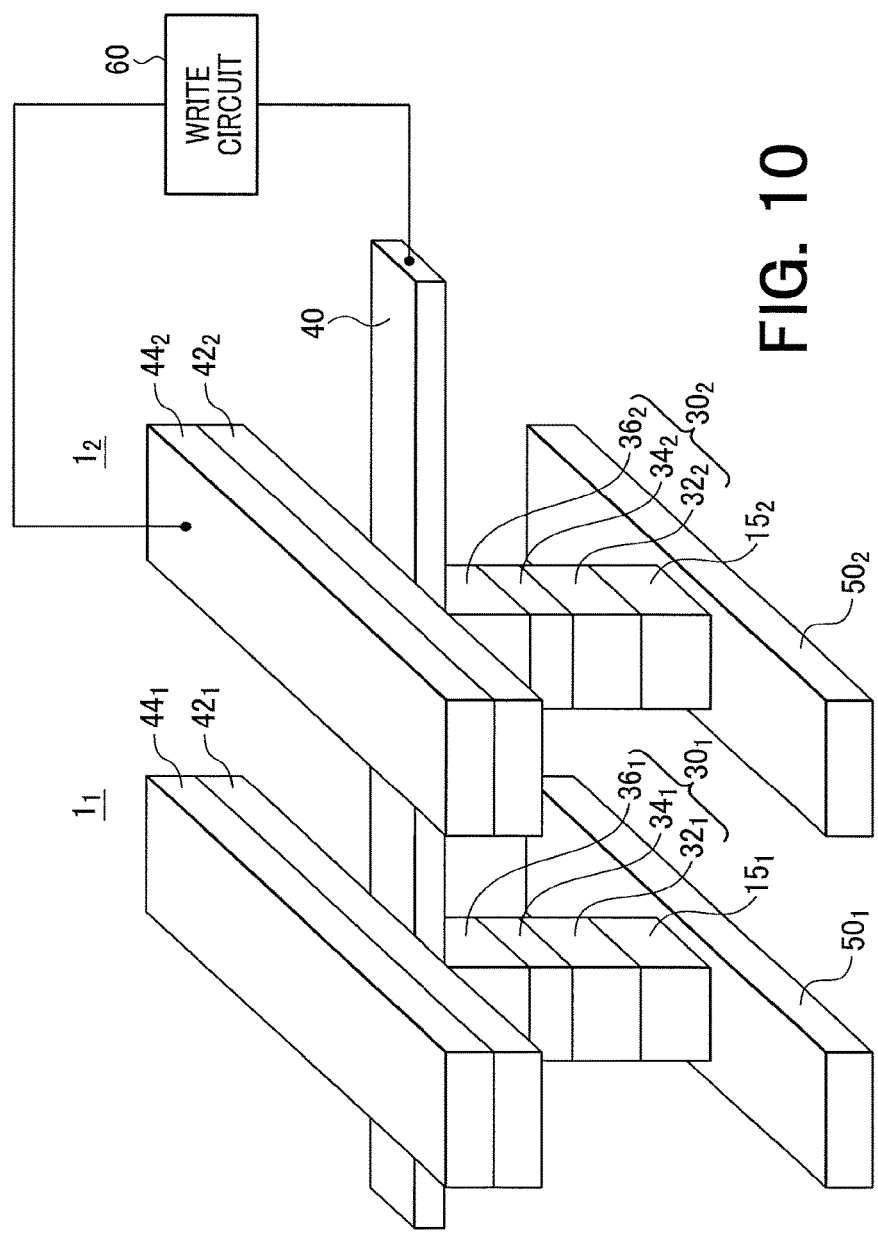
FIG. 10 is a diagram for explaining a writing method of the magnetic memory of the second embodiment.

Writing of the magnetic memory of the second embodiment thus configured is described with reference to FIG. 10.

In writing, similarly to the first embodiment, a write voltage $V_{write}$ is applied between the bit line 40 and the electrode $44_i$ of the memory cell $1_i$ (i=1, 2) to which writing is performed, by a write circuit 60. For example, in a case in which writing is performed to the memory cell $1_2$, the write voltage $V_{write}$ is applied between the bit line 40 and the electrode $44_2$ of the memory cell $1_2$ to which writing is performed. Thus, as described in the first embodiment, the number of electrons is modulated at an interface between the insulating layer $42_2$ and the bit line 40 by the write voltage $V_{write}$ applied between the electrode $44_2$ and the bit line 40, and a direction of magnetization of the storage layer $36_2$ provided below the bit line 40 can be made to be substantially parallel, or antiparallel to a direction of magnetization of a reference layer 32.

Since the magnetic memory of the second embodiment has a crosspoint structure similarly to the first embodiment, there is a problem of half-selection at the time of writing. This problem can be avoided similarly to the first embodiment. For example, a write inhibit voltage, for example, $V_{write}/2$, is applied to an electrode 44 connected to another memory cell connected to the same bit line 40 as that of a memory cell to which writing is performed, and the write inhibit voltage, for example, $V_{write}/2$, is applied to a bit line connected to another memory cell connected to the same electrode 44 as that of the memory cell to which writing is performed. Thus, in the other memory cell connected to the same bit line 40 as that of the memory cell to which writing is performed and the other memory cell connected to the same electrode 44 as that of the memory cell to which writing is performed, a voltage between the bit line 40 and the electrode 44 is $V_{write}/2$, so that it can be prevented that writing is performed.

(Reading Direction)

Figure 11:
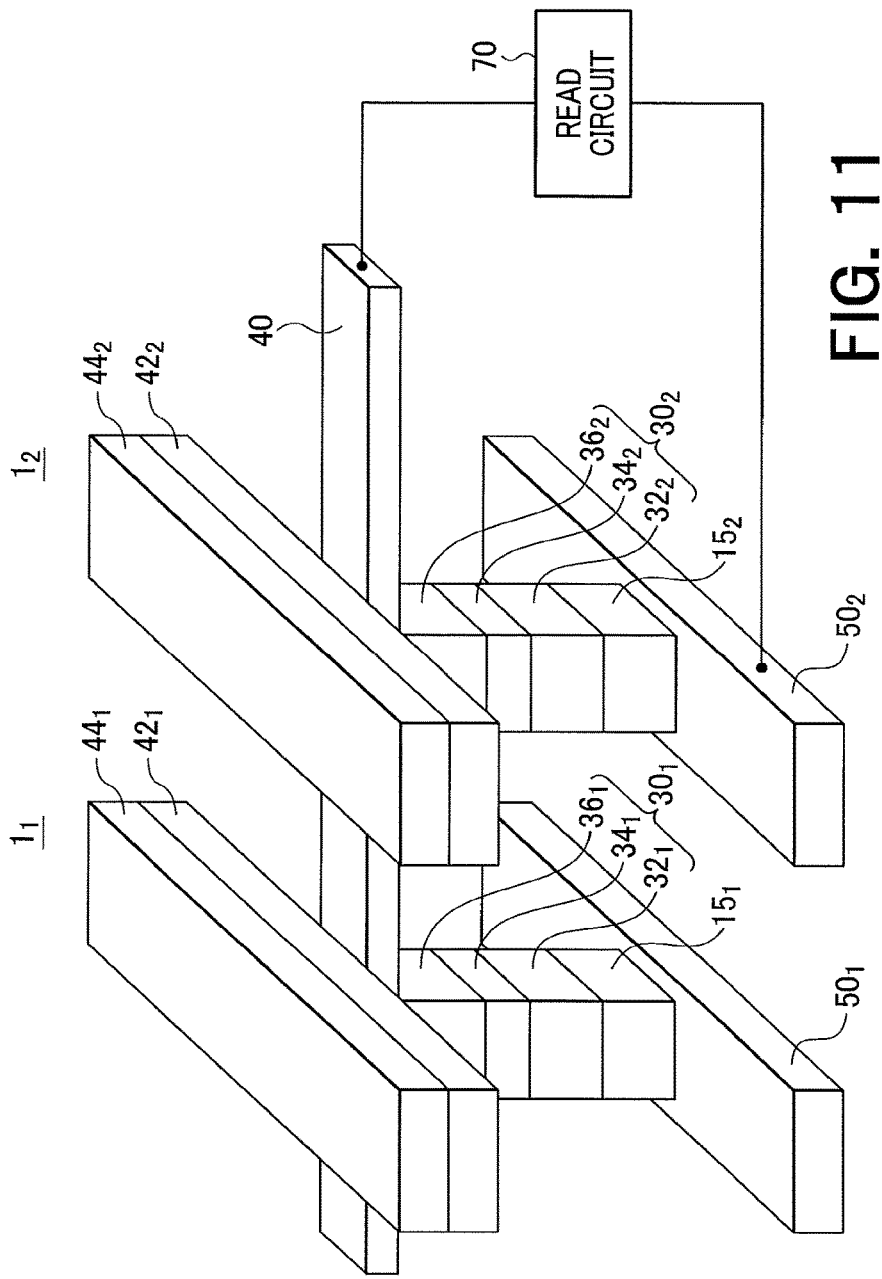
FIG. 11 is a diagram for explaining a reading method of the magnetic memory of the second embodiment.

In reading in the magnetic memory of the second embodiment, as shown in FIG. 11, similarly to the first embodiment, a read voltage is applied between the bit line 40 and a memory cell to which reading is performed, for example, the word line $50_2$ of the memory cell $1_2$, and a read current flowing is detected. Alternatively, the read current is supplied between the bit line 40 and the memory cell to which reading is performed, for example, the word line $50_2$ of the memory cell $1_2$, and a voltage is detected between the bit line 40 and the memory cell.

Incidentally, in the magnetic memory of the second embodiment, the insulating layer $42_i$ (i=1, 2) is shown as extending in the same direction as a direction of the corresponding electrode $44_i$; however, since the extending direction of the insulating layer $42_i$ has no relation to essential operation of the magnetic memory, the insulating layer $42_i$ may be extended in any direction, and further, the insulating layers $42_1$, $42_2$ do not have to be separated for each memory cell. That is, the insulating layers $42_1$, $42_2$ may be connected to each other and formed on an entire surface.

In the magnetic memory of the second embodiment, similarly to the first embodiment, it is possible to use a high dielectric material, so-called High-k material, for the insulating layers $42_1$, $42_2$ to be used for writing, so that modulation rate can be increased of a magnetization state of the storage layer 36 to the voltage applied to the electrode 44.

In addition, in the second embodiment, different from a writing method in which spin transfer torque magnetization switching is used to a normal magnetoresistive effect device, a write current does not flow through the tunnel barrier of the magnetoresistive effect device, so that a requirement for dielectric breakdown of the tunnel barrier also can be eased.

Further, in a case in which the writing method using the above spin transfer torque magnetization switching is used, it is necessary to suppress a resistance of the tunnel barrier by limitation of a value of a current that is allowed to flow through the selection transistor or the like. However, in the second embodiment, similarly to the first embodiment, a tunnel current flowing through the MTJ device 30 only flows during reading, so that the limitation is eliminated of the current value that is allowed to flow through the selection transistor or the like. Therefore, the tunnel resistance of the MTJ device 30 can be determined in consideration of an operating speed of the memory or the like, so that a degree of freedom in design can be increased.

In addition, the second embodiment, different from the first embodiment, has a crosspoint structure using the diode instead of the selection transistor for a read path, so that an occupied area of the memory cell can be made smaller than that of the first embodiment, and a highly integrated memory can be configured.

(First Modification)

Figure 12:
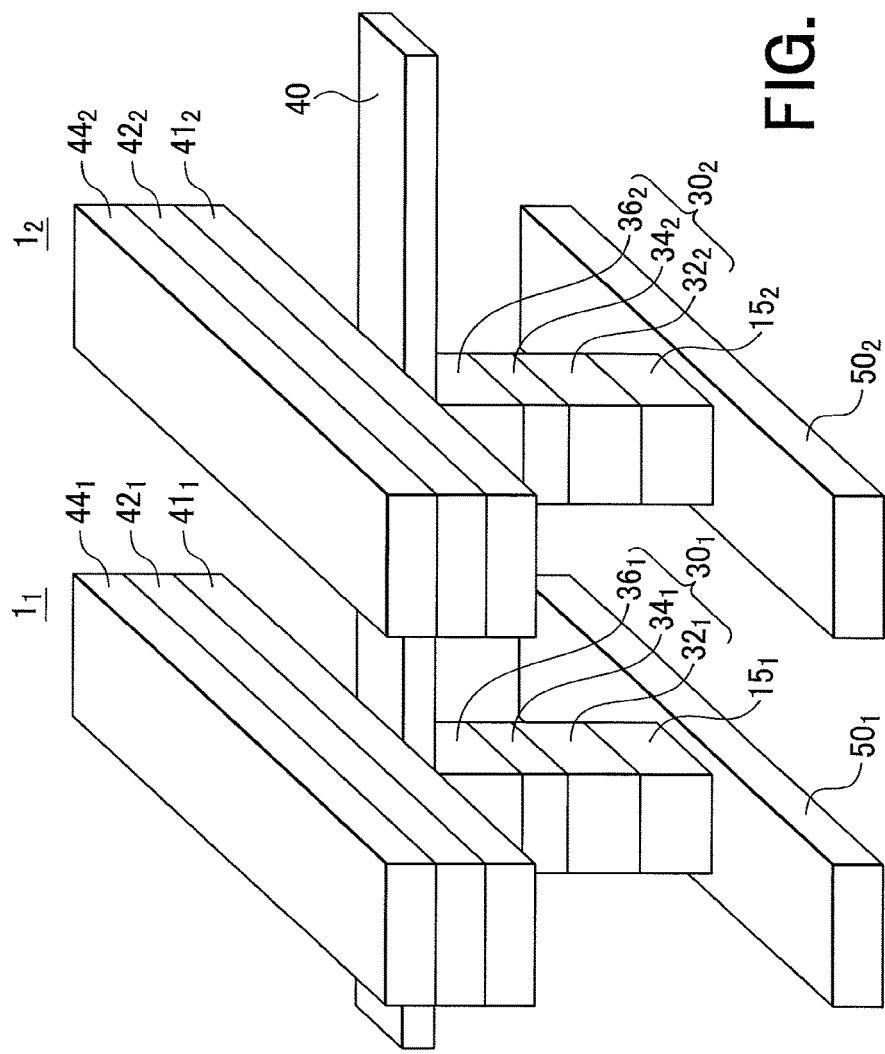
FIG. 12 is a perspective view showing a magnetic memory of a first modification of the second embodiment.

A magnetic memory of a first modification of the second embodiment is described with reference to FIG. 12. FIG. 12 is a perspective view showing a part of the magnetic memory of the first modification. The magnetic memory of the first modification has a configuration in which, in the magnetic memory of the second embodiment, the bit line 40 is formed from a single antiferromagnetic material made of metal, for example, IrMn, and between the bit line 40 of each memory cell $1_i$ (i=1, 2) and the insulating layer $42_i$, an antiferromagnetic material made of oxide, for example, a NiO layer, is arranged. Incidentally, the antiferromagnetic material made of oxide includes Cr oxide ($Cr_2O_3$), Mn oxide (MnO), Fe oxide ($Fe_2O_3$), or Co oxide (CoO), besides NiO.

In the first modification of the second embodiment, similarly to the first modification of the first embodiment, responsiveness to the electrodes $44_1$, $44_2$ can be ensured, and a decrease of a blocking temperature can be prevented. In addition, a laminate structure may be used of electrode/insulating layer/antiferromagnetic material that has the less number of carriers/ferromagnetic material. In this case, in the memory cell of the second embodiment shown in FIG. 9, the bit line 40 is formed from the antiferromagnetic material that has the less number of carriers.

(Second Modification)

Figure 13:
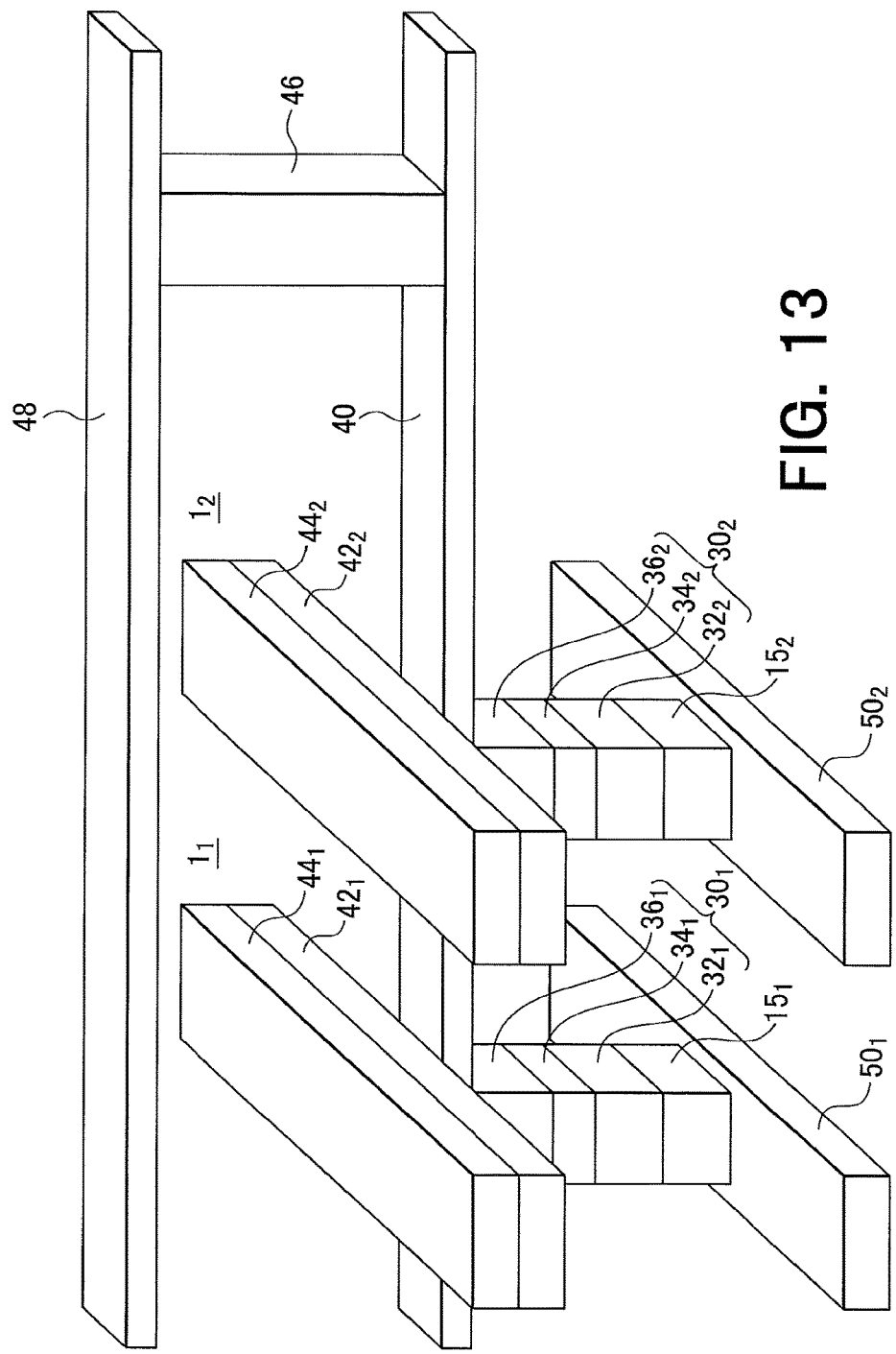
FIG. 13 is a perspective view showing a magnetic memory of a second modification of the second embodiment.

In a case in which there is a problem that a resistance of the wiring line made of the antiferromagnetic material is high, a magnetic memory may be configured as a second modification show in FIG. 13. The magnetic memory of the second modification has a structure in which, in the magnetic memory of the first modification, antiferromagnetic layers $41_1$, $41_2$ made of oxide are removed, and plural memory cells connected to the bit line 40 of the antiferromagnetic material are connected to a low resistance global bit line 48 via a plug 46, in the middle of the bit line 40. As the low resistance global bit line 48, a low resistance material is used, such as Cu or Al.

In the magnetic memory of the second embodiment and the modification thereof, the bit line 40 and the word line $50_j$ of the memory cell $1_i$ (i=1, 2) to which writing is performed are preferably in the same potential (for example, 0 V, a reference potential of the circuit) during writing. This is because, if the potentials are different between the bit line and the word line during writing, unnecessary sneak current may occur and unnecessary power consumption may be caused, or erroneous writing may be caused. Incidentally, by using this method, speed degradation of the circuit can also be suppressed. This is because, if the potentials are different between the bit line and the word line during writing, it takes extra time to pull up the potential of the word line.

Figure 14:
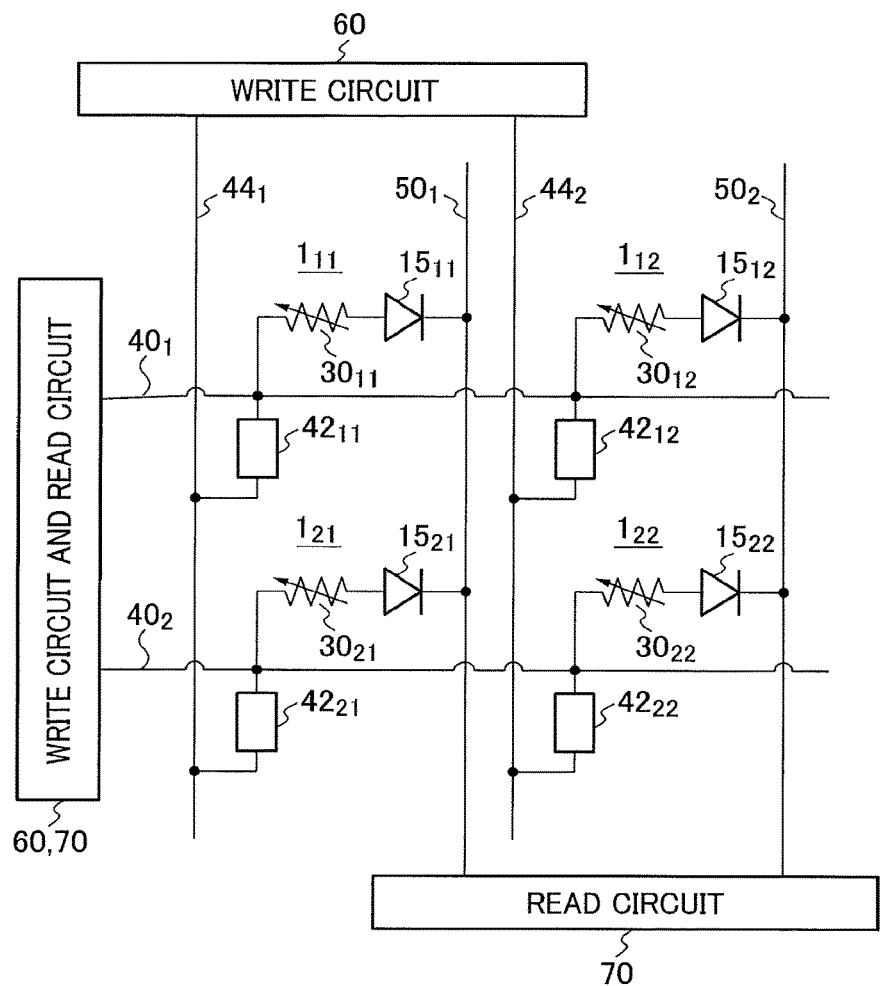
FIG. 14 is a diagram showing an example of a circuit of the magnetic memory of the second embodiment.

Next, an example of a circuit of the magnetic memory of the second embodiment is shown in FIG. 14. In the magnetic memory, the memory cells are arranged in a 2×2 matrix form. In the memory cell $1_{ij}$ (i, j=1, 2), the storage layer $36_{ij}$ of the MTJ device $30_{ij}$ and the insulating layer $42_{ij}$ are connected to the bit line $40_i$.

In addition, in the memory cell $1_{ij}$ (i, j=1, 2), a cathode of the diode $15_{ij}$ is connected to the word line $50_j$, and the insulating layer $42_{ij}$ is connected to the electrode $44_i$.

Each of the bit lines $40_1$, $40_2$ and electrodes $44_1$, $44_2$ is connected to the write circuit 60. In addition, each of the bit lines $40_1$, $40_2$ and word lines $50_1$, $50_2$ is connected to a read circuit 70.

In the magnetic memory circuit shown in FIG. 14, in a case in which writing is performed to the first row and first column memory cell $1_{11}$, the write voltage $V_{write}$ is applied between the bit line $40_1$ and the electrode $44_1$ by the write circuit 60. In a case in which reading is performed from the first row and first column memory cell $1_{11}$, a constant current is supplied between the bit line $40_1$ and the word line $50_1$ by the read circuit 70 and a voltage is read, or the read voltage is applied between the bit line $40_1$ and the word line $50_1$ and a current is read that flows between the bit line $40_1$ and the word line $50_1$.

As described above, with the second embodiment, in writing, the write current does not flow through the tunnel barrier of the MTJ device, and a voltage is applied between the bit line 40 and the electrode 44. The high dielectric can be used as the insulating layer 42 positioned between the bit line 40 and the electrode 44. Thus, a magnetic memory can be provided in which breakdown of the insulating layer is suppressed and voltage writing is possible.

Incidentally, in the first and second embodiments and the modifications thereof, the MTJ device is used as the magneto-resistive device; however, a GMR device may be used in which a nonmagnetic insulating layer (tunnel barrier) 34 of the MTJ device is replaced by a nonmagnetic metal layer.

(Third Embodiment)

Figure 15:
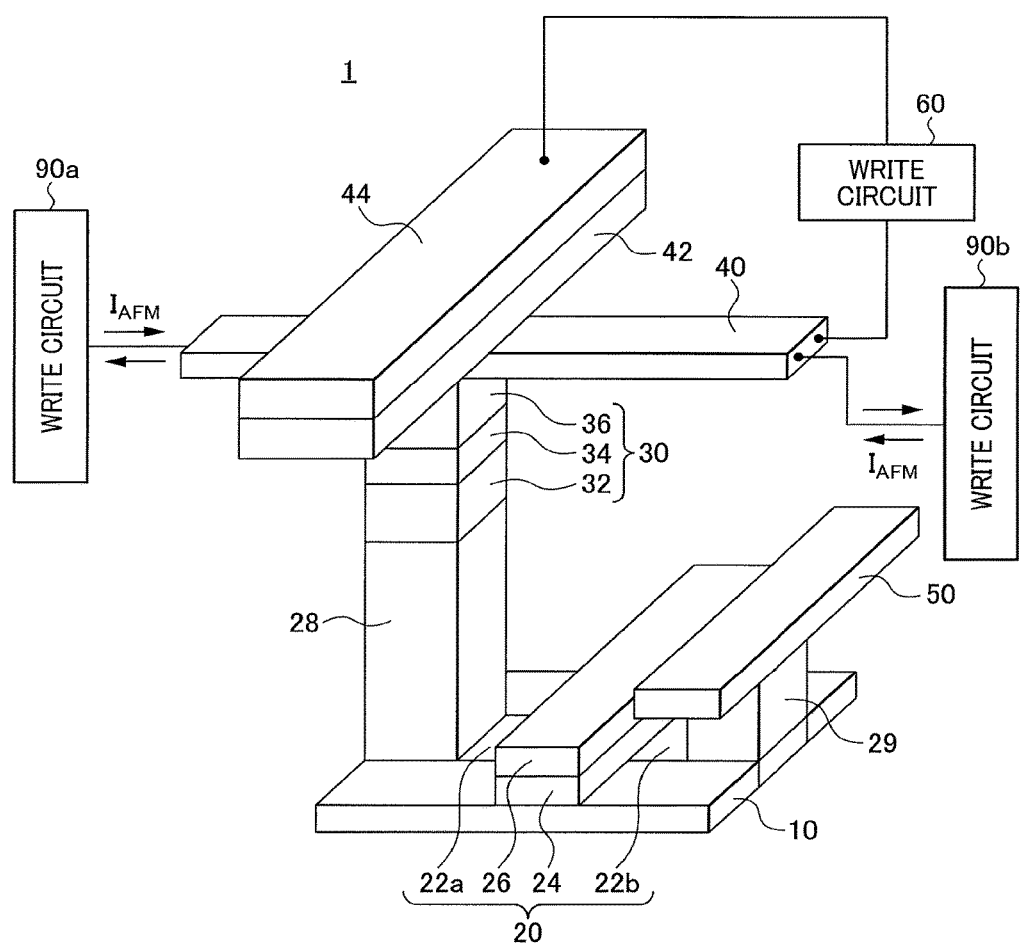
FIG. 15 is a perspective view showing a magnetic memory of a third embodiment.

A magnetic memory according to a third embodiment is shown in FIG. 15. The magnetic memory of the third embodiment is different in a writing method from the magnetic memory of the first embodiment shown in FIG. 1. For example, in the writing method of the first embodiment, a voltage is applied between a bit line 40 containing an antiferromagnetic material and a gate electrode 44 to perform writing.

On the other hand, in the third embodiment, while a write current $I_{AFM}$ is supplied between both ends of the bit line 40 having the antiferromagnetic material by write circuits 90a, 90b, a voltage is applied between the bit line 40 containing the antiferromagnetic material and the gate electrode 44 by a write circuit 60 to a memory cell to which writing is performed. When such a writing method is used, the write current $I_{AFM}$ is supplied between the both ends of the bit line 40 containing the antiferromagnetic material, so that spin-orbit interaction torque between the antiferromagnetic material and the ferromagnetic material also can be utilized for writing. Incidentally, the write current $I_{AFM}$ is supplied in a direction in accordance with a magnetization direction of a storage layer 36. In addition, each of the write circuits 90a, 90b includes a driver and a sinker.

When the write current $I_{AFM}$ is supplied between the both ends of the bit line 40 containing the antiferromagnetic material, the spin-orbit interaction torque is applied to all the memory cells connected to the bit line; however, when a voltage is applied between the bit line 40 containing the antiferromagnetic material and the gate electrode 44 in a memory cell to which writing is desired, in the memory cell, in addition to the magnetization switching by voltage application described in the first embodiment, the spin-orbit interaction torque is applied, so that the magnetization switching is easily caused.

Incidentally, inversely utilizing this, read/write disturb may be suppressed by applying a voltage opposite to the write voltage between the bit line 40 and the gate electrode 44 in a memory cell to which writing is not desired and which is connected to a gate electrode of a memory cell different from the memory cell to which writing is performed.

In addition, a reading method is similar to the method described in the first embodiment.

With the third embodiment, similarly to the first embodiment, a magnetic memory can be provided in which breakdown of the insulating layer is suppressed and voltage writing is possible.

(Fourth Embodiment)

Figure 16:
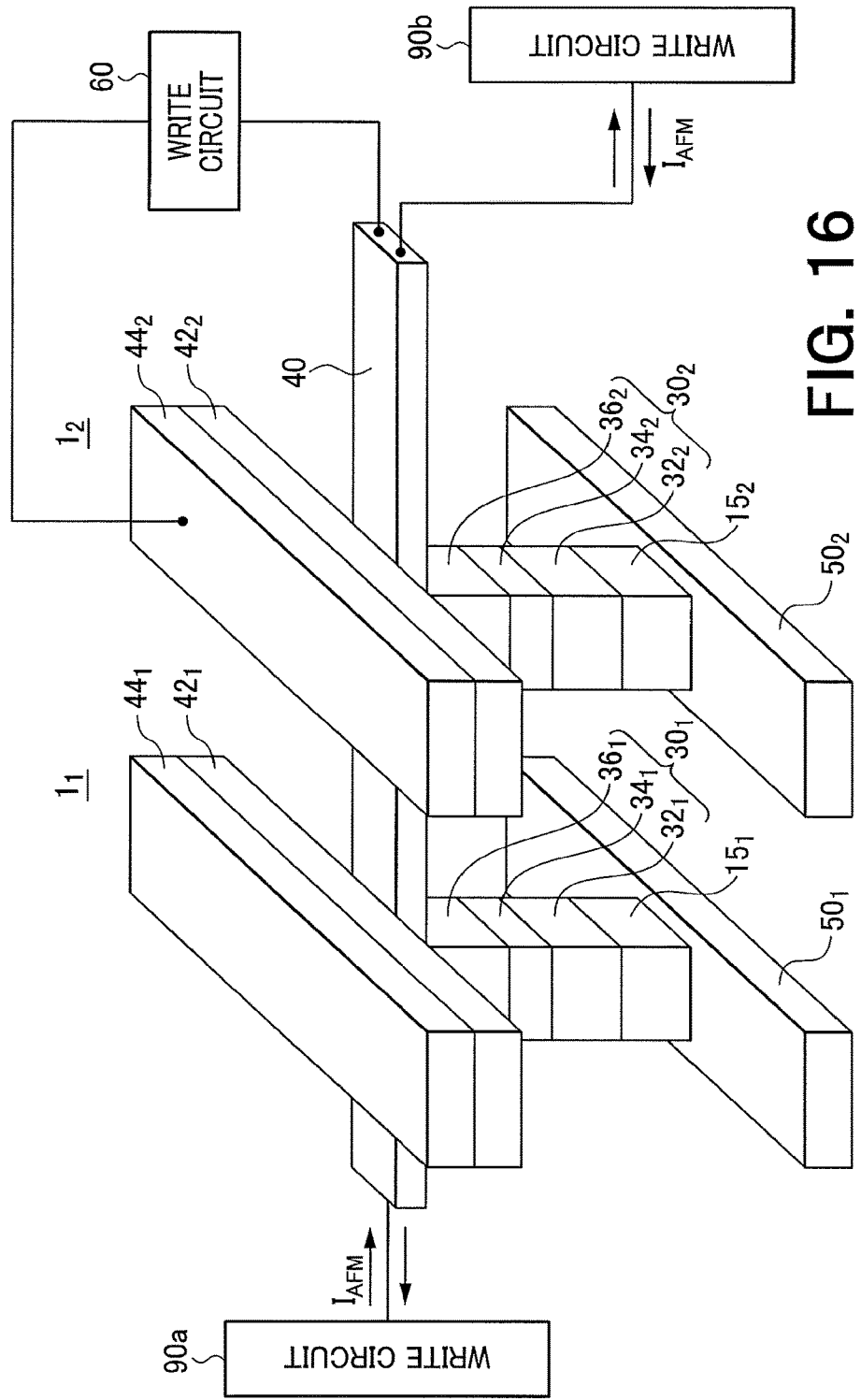
FIG. 16 is a perspective view showing a magnetic memory of a fourth embodiment.

A magnetic memory according to a fourth embodiment is shown in FIG. 16. The magnetic memory of the fourth embodiment is different in a writing method from the magnetic memory of the second embodiment shown in FIG. 9. For example, in the writing method of the first embodiment, a voltage is applied between a bit line 40 containing an antiferromagnetic material and a gate electrode 44 to perform writing.

On the other hand, in the fourth embodiment, while a write current $I_{AFM}$ is supplied between both ends of the bit line 40 having the antiferromagnetic material by write circuits 90a, 90b, a voltage is applied between the bit line 40 containing the antiferromagnetic material and the gate electrode 44 by a write circuit 60 to a memory cell to which writing is performed. When such a writing method is used, the write current $I_{AFM}$ is supplied between the both ends of the bit line 40 containing the antiferromagnetic material, so that spin-orbit interaction torque between the antiferromagnetic material and the ferromagnetic material also can be utilized for writing. Incidentally, the write current $I_{AFM}$ is supplied in a direction in accordance with a magnetization direction of a storage layer 36. In addition, each of the write circuits 90a, 90b includes a driver and a sinker.

When the write current $I_{AFM}$ is supplied between the both ends of the bit line 40 containing the antiferromagnetic material, the spin-orbit interaction torque is applied to all the cell connected to the bit line; however, when a voltage is applied between the bit line 40 containing the antiferromagnetic material and the gate electrode 44 in the memory cell to which writing is performed, in the memory cell, in addition to the magnetization switching by voltage application described in the first embodiment, the spin-orbit interaction torque is applied, so that the magnetization switching is easily caused.

Incidentally, inversely utilizing this, read/write disturb can be suppressed by applying a voltage opposite to the write voltage between the bit line 40 and the gate electrode 44 in a memory cell to which writing is not desired and which is connected to a gate electrode of a memory cell different from the memory cell to which writing is performed.

In addition, a reading method is similar to the method described in the second embodiment.

With the fourth embodiment, similarly to the second embodiment, a magnetic memory can be provided in which breakdown of the insulating layer is suppressed and voltage writing is possible.

(Fifth Embodiment)

Figure 17:
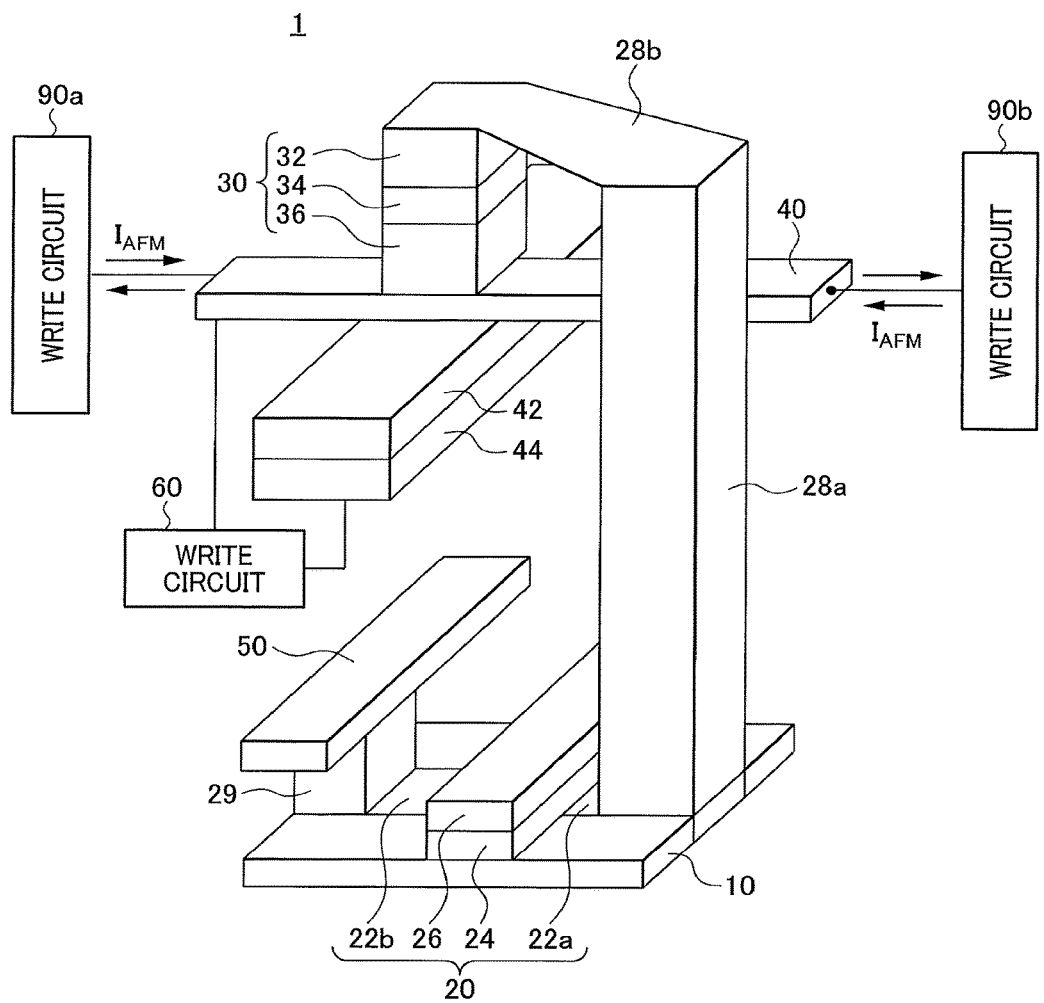
FIG. 17 is a perspective view showing a magnetic memory of a fifth embodiment.

A magnetic memory according to a fifth embodiment is shown in FIG. 17. The magnetic memory of the fifth embodiment has a structure in which, in comparison with the magnetic memory of the third embodiment shown in FIG. 15, a reference layer 32 is arranged above a storage layer 36 in a magneto-resistive device 30. For this reason, the magnetic memory has a structure in which a bit line 40 is arranged below the magneto-resistive device 30, and an insulating layer 42 is arranged below the bit line 40, and an electrode 44 is arranged below the insulating layer 42. In addition, the magnetic memory has a configuration in which a plug 28 shown in FIG. 15 is replaced by a plug 28a connected to a terminal 22a of a transistor 20, and a wiring line 28b connected to the plug 28a and the reference layer 32 of the magneto-resistive device 30.

Also in the fifth embodiment, write operation and read operation are performed similarly to the third embodiment.

With the fifth embodiment thus configured, similarly to the third embodiment, a magnetic memory can be provided in which breakdown of the insulating layer is suppressed and voltage writing is possible.

(Sixth Embodiment)

Figure 18:
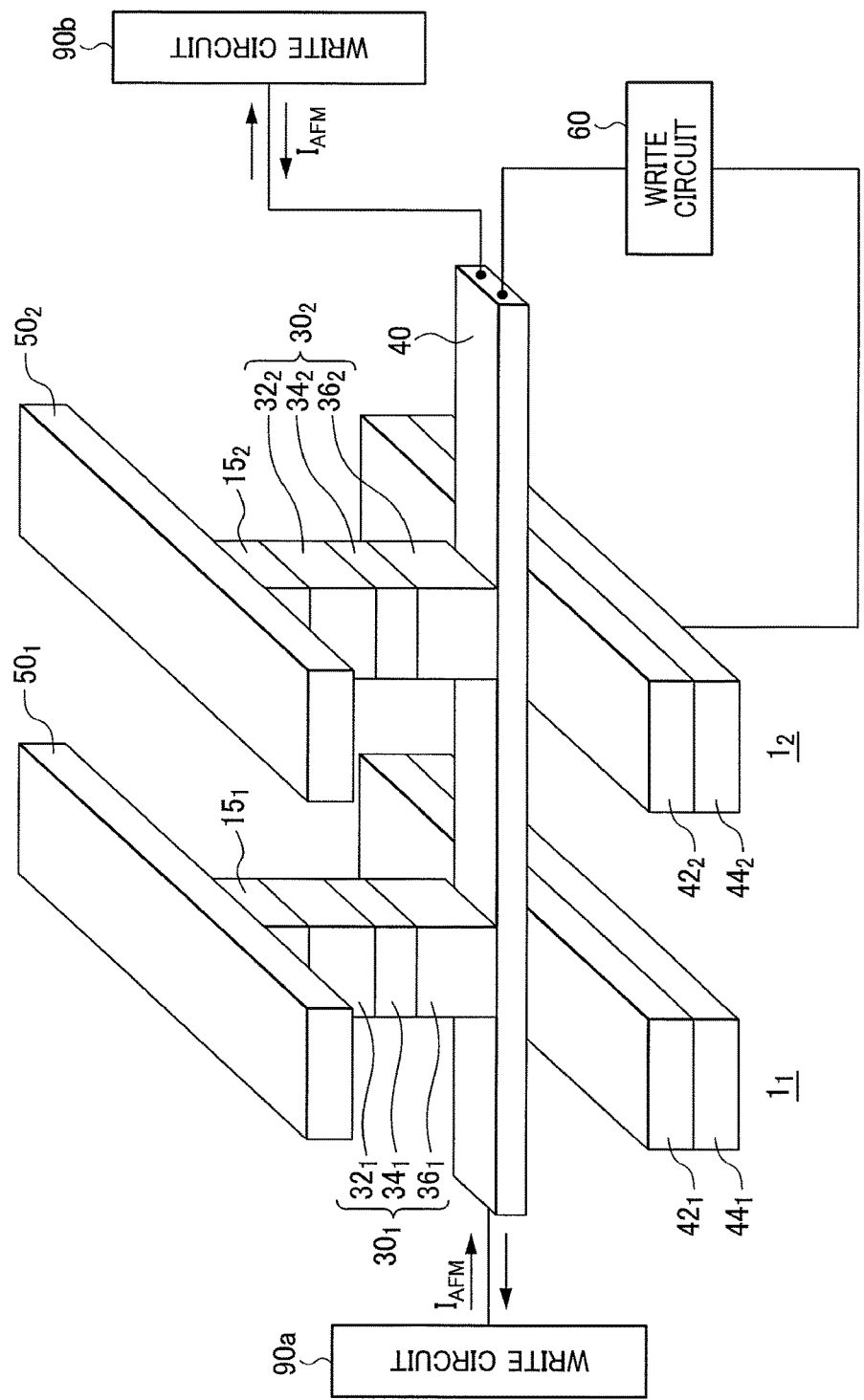
FIG. 18 is a perspective view showing a magnetic memory of a sixth embodiment.

A magnetic memory according to a sixth embodiment is shown in FIG. 18. The magnetic memory of the sixth embodiment has a structure in which, in comparison with the magnetic memory of the fourth embodiment shown in FIG. 16, the reference layers $32_1$, $32_2$ are respectively arranged above the storage layers $36_1$, $36_2$ in the magneto-resistive devices $30_1$, $30_2$. For this reason, the magnetic memory has a structure in which a bit line 40 is arranged below the magneto-resistive devices $30_1$, $30_2$, and insulating layers $42_1$, $42_2$ are arranged below the bit line 40, and electrodes $44_1$, $44_2$ are respectively arranged below the insulating layers $42_1$, $42_2$. In addition, word lines $50_1$, $50_2$ are respectively arranged above the magneto-resistive devices $30_1$, $30_2$.

Also in the sixth embodiment, write operation and read operation are performed similarly to the fourth embodiment.

With the sixth embodiment thus configured, similarly to the fourth embodiment, a magnetic memory can be provided in which breakdown of the insulating layer is suppressed and voltage writing is possible.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
   a magnetoresistive device including a first magnetic layer having a fixed magnetization, a second magnetic layer having a changeable magnetization, and a first nonmagnetic layer between the first magnetic layer and the second magnetic layer;
a first wiring electrically connected to the first magnetic layer;
a second wiring including an antiferromagnetic material, the second wiring being in contact with the second magnetic layer;
a third wiring crossing the second wiring;
an insulating layer between the second wiring and the third wiring, the insulating layer including Al oxide, LaAlSi oxide, Hf oxide, LaAl oxide, Zr oxide, La oxide, or Ti oxide; and
a first write circuit that applies a voltage between the second wiring and the third wiring.

2. The memory according to claim 1, further comprising a selection device between the first wiring and the first magnetic layer.

3. The memory according to claim 1, wherein
the antiferromagnetic material includes at least one of IrMn, FeMn, PtMn, PtCrMn, NiMn, Ni oxide, Cr oxide, Mn oxide, Fe oxide, or Co oxide.

4. The memory according to claim 1, further comprising an antiferromagnetic layer in which a number of carriers is less than that in the antiferromagnetic material included in the second wiring, the antiferromagnetic layer being between the second wiring and the insulating layer.

5. The memory according to claim 1, further comprising an antiferromagnetic layer being between the second wiring and the insulating layer, wherein
the antiferromagnetic material included in the second wiring includes at least one of IrMn, FeMn, PtMn, PtCrMn, or NiMn, and the antiferromagnetic layer includes at least one of Ni oxide, Cr oxide, Mn oxide, Fe oxide, Co oxide, MnGa, or MnAs.

6. The memory according to claim 1, further comprising a fourth wiring that is electrically connected to the second wiring and has a lower electrical resistance than that of the second wiring.

7. The memory according to claim 1, further comprising a second write circuit that supplies current to the second wiring.

8. The memory according to claim 1, wherein the second wiring includes a portion corresponding to a cross region in which the second wiring crosses the third wiring, and the antiferromagnetic material is included at least in the portion.

9. The memory according to claim 8, wherein the second magnetic layer is located between the portion and the first nonmagnetic layer.

10. The memory according to claim 1, further comprising a read circuit electrically connected to the first wiring and the second wiring.

11. The magnetic memory according to claim 1, wherein a write current does not flow through the first magnetic layer, the first nonmagnetic layer, and the second magnetic layer.

12. The magnetic memory according to claim 1, wherein a leak current flows through the first magnetic layer, the first nonmagnetic layer, and the second magnetic layer during writing.

13. A magnetic memory comprising:
a magnetoresistive device including a first magnetic layer having a fixed magnetization, a second magnetic layer having a changeable magnetization, and a first nonmagnetic layer between the first magnetic layer and the second magnetic layer;
a first wiring electrically connected to the first magnetic layer;
a second wiring including an antiferromagnetic material, the second wiring being in contact with the second magnetic layer;
a third wiring crossing the second wiring;
an insulating layer between the second wiring and the third wiring; and
a first write circuit that applies a voltage between the second wiring and the third wiring,
wherein
a magnetization direction of the second magnetic layer at the time of applying a first voltage between the second wiring and the third wiring by the first write circuit is different from a magnetization direction of the second magnetic layer at the time of applying a second voltage between the second wiring and the third wiring by the first write circuit, the first voltage having a first polarity, and the second voltage having a second polarity different from the first polarity.

14. The memory according to claim 13, further comprising
a fourth wiring that is electrically connected to the second wiring and has a lower electrical resistance than that of the second wiring.

15. The memory according to claim 13, wherein
the insulating layer includes Al oxide, LaAlSi oxide, Hf oxide, LaAl oxide, Zr oxide, La oxide, or Ti oxide.

16. The memory according to claim 13, wherein the second wiring includes a portion corresponding to a cross region in which the second wiring crosses the third wiring, and the antiferromagnetic material is included at least in the portion.

17. The memory according to claim 16, wherein the second magnetic layer is located between the portion and the first nonmagnetic layer.

18. The memory according to claim 13, further comprising
a selection device between the first wiring and the first magnetic layer.

19. The memory according to claim 13, wherein
the antiferromagnetic material includes at least one of IrMn, FeMn, PtMn, PtCrMn, NiMn, Ni oxide, Cr oxide, Mn oxide, Fe oxide, or Co oxide.

20. The memory according to claim 13, further comprising
an antiferromagnetic layer in which a number of carriers is less than that in the antiferromagnetic material contained in the second wiring, the antiferromagnetic layer being between the second wiring and the insulating layer.

21. The memory according to claim 13, further comprising
an antiferromagnetic layer being between the second wiring and the insulating layer, wherein
the antiferromagnetic material included in the second wiring includes at least one of IrMn, FeMn, PtMn, PtCrMn, or NiMn, and the antiferromagnetic layer includes at least one of Ni oxide, Cr oxide, Mn oxide, Fe oxide, Co oxide, MnGa, or MnAs.

22. The memory according to claim 13, further comprising
a second write circuit that supplies current to the second wiring.

23. The memory according to claim 13, further comprising a read circuit electrically connected to the first wiring and the second wiring.

24. A magnetic memory comprising:
a magnetoresistive device including a first magnetic layer having a fixed magnetization, a second magnetic layer having a changeable magnetization, and a first nonmagnetic layer between the first magnetic layer and the second magnetic layer;
a first wiring electrically connected to the first magnetic layer;
a second wiring including an antiferromagnetic material, the second wiring being in contact with the second magnetic layer;
a third wiring crossing the second wiring;
an insulating layer between the second wiring and the third wiring; and
a first write circuit configured to apply a voltage between the second wiring and the third wiring,
wherein the second magnetic layer has a first magnetization direction if the voltage has a first polarity, and a second magnetization direction if the voltage has a second polarity, the first magnetization direction being different from the second magnetization direction.

25. The memory according to claim 23, further comprising
a selection device between the first wiring and the first magnetic layer.

26. The memory according to claim 23, wherein
the antiferromagnetic material includes at least one of IrMn, FeMn, PtMn, PtCrMn, NiMn, Ni oxide, Cr oxide, Mn oxide, Fe oxide, or Co oxide.

27. The memory according to claim 23, further comprising
an antiferromagnetic layer in which a number of carriers is less than that in the antiferromagnetic material included in the second wiring, the antiferromagnetic layer being between the second wiring and the insulating layer.

28. The memory according to claim 23, further comprising
an antiferromagnetic layer being between the second wiring and the insulating layer, wherein
the antiferromagnetic material included in the second wiring includes at least one of IrMn, FeMn, PtMn, PtCrMn, or NiMn, and the antiferromagnetic layer includes at least one of Ni oxide, Cr oxide, Mn oxide, Fe oxide, Co oxide, MnGa, or MnAs.

29. The memory according to claim 23, further comprising
a fourth wiring that is electrically connected to the second wiring and has a lower electrical resistance than that of the second wiring.

30. The memory according to claim 23, wherein the second wiring includes a portion corresponding to a cross region in which the second wiring crosses the third wiring, and the antiferromagnetic material is included at least in the portion.

31. The memory according to claim 30, wherein the second magnetic layer is located between the portion and the first nonmagnetic layer.

* * * * *